United States Patent [19]

Hironaka

[11] Patent Number: 5,272,364
[45] Date of Patent: Dec. 21, 1993

[54] SEMICONDUCTOR PHOTODETECTOR DEVICE WITH SHORT LIFETIME REGION

[75] Inventor: Misao Hironaka, Itami, Japan

[73] Assignee: Mitsubishi Denki Kabushiki Kaisha, Tokyo, Japan

[21] Appl. No.: 906,222

[22] Filed: Jun. 24, 1992

[30] Foreign Application Priority Data

Jul. 1, 1991 [JP] Japan .................. 3-160233

[51] Int. Cl.$^5$ .............................. H01L 27/14
[52] U.S. Cl. .................. 257/185; 257/186; 257/187; 257/438; 257/439
[58] Field of Search ............ 257/186, 187, 184, 185, 257/438, 439

[56] References Cited

U.S. PATENT DOCUMENTS 5,040,039  8/1991  Hattori et al. ............ 357/30

FOREIGN PATENT DOCUMENTS

| 0186460 | 7/1986 | European Pat. Off. |
|---|---|---|
| 56-158487 | 12/1981 | Japan ............. 257/438 |
| 57-93584 | 6/1982 | Japan ............. 257/187 |
| 58-115873 | 7/1983 | Japan ............. 257/438 |
| 60-34079 | 2/1985 | Japan ............. 257/187 |
| 61-283178 | 12/1986 | Japan . |
| 62-211967 | 9/1987 | Japan ............. 257/187 |
| 62-219676 | 9/1987 | Japan ............. 257/187 |
| 63-224268 | 9/1988 | Japan . |
| 1-125989 | 5/1989 | Japan . |
| 1-161778 | 6/1989 | Japan . |
| 1-205477 | 8/1989 | Japan . |
| 1-310579 | 12/1989 | Japan . |
| 2-214171 | 2/1990 | Japan . |
| 2-240974 | 9/1990 | Japan . |
| 2-291180 | 11/1990 | Japan . |

*Primary Examiner*—William Mintel
*Attorney, Agent, or Firm*—Leydig, Voit & Mayer

[57] ABSTRACT

A semiconductor photodetector device includes a second conductivity type region extending through a first conductivity type window layer to a first conductivity type light absorbing layer and a short carrier lifetime region surrounding ht second conductivity type region such that the lifetime of minority carriers generated in the light absorbing layer outside a depletion layer located around the second conductivity type region is significantly shorter than the lifetime of minority carriers elsewhere within the light absorbing layer. The photodetector device can respond quickly to variations in incident light because the collection of charge carriers generated in the light absorbing layer outside the depletion layer is reduced.

14 Claims, 3 Drawing Sheets

SEMICONDUCTOR PHOTODETECTOR DEVICE WITH SHORT LIFETIME REGION

This invention relates to a photodetector device, such as a photodiode (PD) and a avalanche photodiode (APD), and more particularly to a photodetector device having a fast response to incident light.

BACKGROUND OF THE INVENTION

FIG. 1 is a plan view of a conventional InGaAs planar PD described for example in Collection of Drafts of Lectures at 1986 General National Meeting of The Institute of Electronics and Communication Engineers of Japan, No. 978, pages 4–149. FIG. 2 shows a cross-sectional view of the device shown in FIG. 1 along the line 2—2. In FIG. 2, on an n+-type InP substrate 1, an n-type InP buffer layer 2, an n⁻-type InGaAs light absorbing layer 3, and an n⁻-type InP window layer 4 are disposed in the named order in a stack. A p-type impurity, such as Zn, is diffused through part of the surface of the n⁻-type window layer 4 to form a reversed conductivity type region, namely, a p+-type region 5. The bottom portion of the p+-type region 5 is in contact with the n⁻-type InGaAs light absorbing layer 3. A broken line 6 represents a front of a depletion layer 31. The depletion layer front 6 serves substantially as a PN junction between the p+-type region 5 and the n⁻-type InP window layer 4 and the n⁻-type InGaAs light absorbing layer 3.

Over the top surface of the n⁻-type InP window layer 4, except for a light receiving region 10, a light-transparent surface protection film 11 of, for example silicon nitride (SiN) is deposited by, for example, plasma CVD. A p-electrode (anode) 12 is disposed on the surface protection film 11 along the periphery of the light receiving region 10. The p-electrode 12 is in ohmic contact with the p+-type region 5. As shown in FIG. 1, a portion of the p-electrode 12 extends outward to provide an electrode pad 13 for wire bonding. An anode wire 14 is bonded to the electrode pad 13. Returning again to FIG. 2 an n-electrode (cathode) 15 is disposed on the bottom surface of the substrate 1. Incident light 16 generates pairs of electrons 17 and holes 18 in the light absorbing layer 3.

Now the operation of the conventional photodiode shown in FIGS. 1 and 2 is explained. The InGaAs light absorbing layer 3 which is formed by crystal growth on the n+-type InP substrate 1 and has a lattice constant matching that of the InP substrate 1 has a bandgap wavelength λg of about 1.67 μm. The bandgap wavelength λg of the InP window layer 4 is about 0.93 μm. Accordingly, the range of wavelengths of light to which the InGaAs photodiode shown in FIGS. 1 and 2 is sensitive is approximately from 1.0 μm to 1.6 μm (λ≈1.0–1.6 μm). Therefore, in the following explanation, the wavelength λ of incident light 16 is assumed to be about 1.3 μm.

Generally a photodiode is used with no bias or with a reverse bias applied to it. In the conventional photodiode shown in FIGS. 1 and 2 too, 0 V or a negative voltage of from −5 V to −10 V with reference to the potential at the n-electrode 15 is applied to the p-electrode 12. The carrier concentration of the n⁻-type InP window layer 4 is on the order of $1 \times 10^{16}$ cm$^{-3}$ and that of the n⁻-type InGaAs light absorbing layer 3 is on the order of $5 \times 10^{15}$ cm$^{-3}$ which is smaller than that of the window layer 4. Accordingly, under the reverse bias condition in particular, the depletion layer 31 extends chiefly in the light absorbing layer 3.

When light 16 having λ≈1.3 μm is incident on the light receiving surface, it is not absorbed by the n⁻-type InP window layer 4 having λg≈0.93 μm but is absorbed by the n⁻-type InGaAs light absorbing layer 3 of which λg is about 1.67 μm. This causes the generation of pairs of electrons 17 and holes 18 in the light absorbing layer 3. The carriers comprising pairs of electrons 17 and holes 18 generated in the depletion layer 31 within the layer, 3 are extracted through the electrodes 12 and 15, as a drift current caused by the electric field in the depletion layer 31, which current is monitored as photocurrent by an external circuit. Those holes which are generated outside and diffuse into the depletion layer 31 are extracted as part of the drift current. The magnitude of the photocurrent and hence the sensitivity of the device is increased by lowering the carrier concentration in the n⁻-type InGaAs light absorbing layer 3, which increases the width of the depletion layer 31 so that the proportion of carriers contributing to the drift current increases. This also increases the breakdown voltage. Furthermore, by choosing the values of the thickness t and the index of refraction n of the surface protection film 11 in relation to the index of refraction $n_s$ of the n⁻-type InP window layer 4, the index refraction in vacuum, $n_o$, and the wavelength λ of incident light 16 such that the following expressions (1) and (2) are fulfilled the surface protection film 11 has a zero reflectivity or 100% transmissivity, that is, the surface protection film 11 becomes a so-called AR coating film.

$$t = \frac{\lambda}{4n} \qquad (1)$$

$$n = \sqrt{n_s \cdot n_0} \qquad (2)$$

The sensitivity of the photodetector device can be increased by about 40% by using an AR surface protection film.

In the conventional InGaAs planar-type photodiode with the above-described structure, light 16 is incident on the entire surface of the photodiode, so light incident on areas other than the light receiving region 10 and advancing into regions other than the depletion layer 31 also causes pairs of electrons 17 and holes 18 to be generated. Holes which diffuse into the depletion layer 31 are extracted as photocurrent. However, because the diffusion speed is significantly lower than the drift speed, a delay is exhibited between the photocurrent based on the carriers generated within or near the depletion layer 31 and the photocurrent based on the holes generated outside and diffusing into the depletion layer 31 when they are monitored by an external circuit. FIG. 3 shows the example of a waveform of pulse-shaped incident light 16, and FIG. 4 shows photocurrent generated in response to the intensity variations of the incident light 16 shown in FIG. 3. The incident light 16 has a pulse-shaped waveform, as shown in FIG. 3, which rises at a time $t_1$, starts to fall at a time $t_2$, and reaches a minimum a time period $t_{f1}$ after $t_2$. The photocurrent monitored by the external circuit will have a waveform 20 shown in FIG. 4, which falls to a minimum a time period $t_{f2}$ which is longer than $t_1$, after the time $t_2$. From this, it is understood that the above-described conventional InGaAs planar-type photodiode cannot respond fast to incident light which changes at a high speed.

Now, several examples of known photodiodes having an improved photocurrent response characteristic are described.

(1) Photodiode shown in FIG. 1 of Japanese Unexamined Patent Publication No. HEI 1-161778:

The photodiode shown in FIG. 1 of Japanese Unexamined Patent Publication No. HEI 1-161778 is formed by removing those portions of a window layer and a light absorbing layer which are outside a PN junction near a p+-type diffusion region. Since no carriers are generated by light absorption outside the junction formed by the p+-type region, no photocurrent which would otherwise result from holes diffused into a depletion region is present. Thus, the photodiode exhibits an improved photocurrent-to-incident light response. However, in order to produce this photodiode, it is necessary to completely etch away the portions of the window layer and the light receiving layer outside the PN junction which is disadvantageously time consuming. Another disadvantage is that portions of a protection film and conductor leads disposed over steps formed by such an etching process are susceptible to defects and disconnections depending on the step coverage.

(2) Semiconductor photodetector device shown in FIG. 1 of Japanese Unexamined Patent Publication No. HEI 2-214171:

This photodetector device includes a ring-shaped floating p+-type region which surrounds a light-receiving p+-type diffusion region. The field formed within the depletion layer generated by the floating p+-type region prevents the diffusion of carriers which could cause a slow response. However, it is difficult to control the diffusion of an impurity, such as Zn, so as to provide the desired depth and thickness for the floating p+-type region, and consequently, the prevention of the diffusion of carriers which could cause slow response is insufficient.

(3) Semiconductor photodetector device shown in FIG. 1 of Japanese Unexamined Patent Publication No. HEI 2-240974:

The semiconductor photodetector device disclosed in this publication comprises a stack of an HR (highly reflective) coating, a light absorbing region, and an AR (anti-reflective) coating in the named order along the periphery of a light receiving region, whereby light is prevented from entering into the crystal through portions other than the light receiving region. Due to difficulty in forming the structure surrounding the light receiving region, in particular, difficulty in forming the crystalline light absorbing region on the HR coating, it is relatively difficult to fabricate this photodetector device.

(4) Semiconductor photodetector device shown in FIG. 1 of Japanese Unexamined Patent Publication No. HEI 1-310579:

The photodetector device disclosed in this publication includes an n+-type InP substrate with a groove formed therein, an InGaAs light absorbing layer disposed in the groove, and p+-type diffusion region disposed on the light absorbing layer and on the surface portion of the substrate around the light absorbing layer. The crystallographic properties of the light absorbing layer disposed within the groove are not good, and the depletion layer extends across the entire light absorbing layer so the proportion of current attributable the light entering through regions other than &he light receiving region is large.

(5) Photodiode shown in FIG. 1 of Japanese Unexamined Patent Publication No. HEI 2-291180:

A high concentration region is disposed around a p+-type region in a substrate. A maximum field intensity at the PN junction between the substrate and the p+-type region increases in the high concentration region, which undesirably reduces the withstanding voltage of the device and increases surface leakage current.

(6) Photodiode shown in FIG. 1 of Japanese Unexamined Patent Publication No. HEI 1-205477:

The photodiode disclosed in this publication includes a high impurity concentration region of p+-type conductivity which is opposite to that of a light receiving layer and a window layer, disposed around a light receiving portion. The p+-type high impurity concentration region is not for the purpose of preventing diffusion current, which could cause a slow response speed, from being monitored in an external circuit, but for the purpose of suppressing surface leakage current. Accordingly, this p+-type high impurity concentration region does not improve the speed of response to incident light changes.

SUMMARY OF THE INVENTION

An object of the present invention is to eliminate the problems seen in conventional semiconductor photodetectors or photodiodes like the ones described above. A photodetector device according to the present invention comprises a reversed conductivity type region extending through a window layer into a light absorbing layer, and a region formed outside the reversed conductivity type region to surround the reverse conductivity type region. This surrounding region is so formed that the lifetime of minority carriers generated in it is substantially shorter than that of minority carriers generated in the light absorbing layer near the bottom of the reversed conductivity type region. This surrounding region is hereinafter referred to as a "short carrier lifetime region".

In the semiconductor photodetector device according to the present invention, minority carriers could be generated in portions of the light absorbing layer outside and around the depletion layer in response to light incident on portions other than the light receiving region above the reversed conductivity type region but they are rapidly recombine with majority carriers in the short lifetime region so that their lifetime is significantly shortened. The diffusion length of the minority carriers L is significantly shorten as shown by the expression:

$$L = \sqrt{D\tau} \qquad (3)$$

where D is a diffusion constant and $\tau$ is the lifetime of the minority carriers. Consequently, the minority carriers generated in those portions of the light absorbing layer outside the depletion layer do not contribute to the photocurrent and, therefore, the response current waveform has no trailing edge. Thus, the photodetector device of the present invention can operate fast.

DETAILED DESCRIPTION OF THE INVENTION

Figure 5:
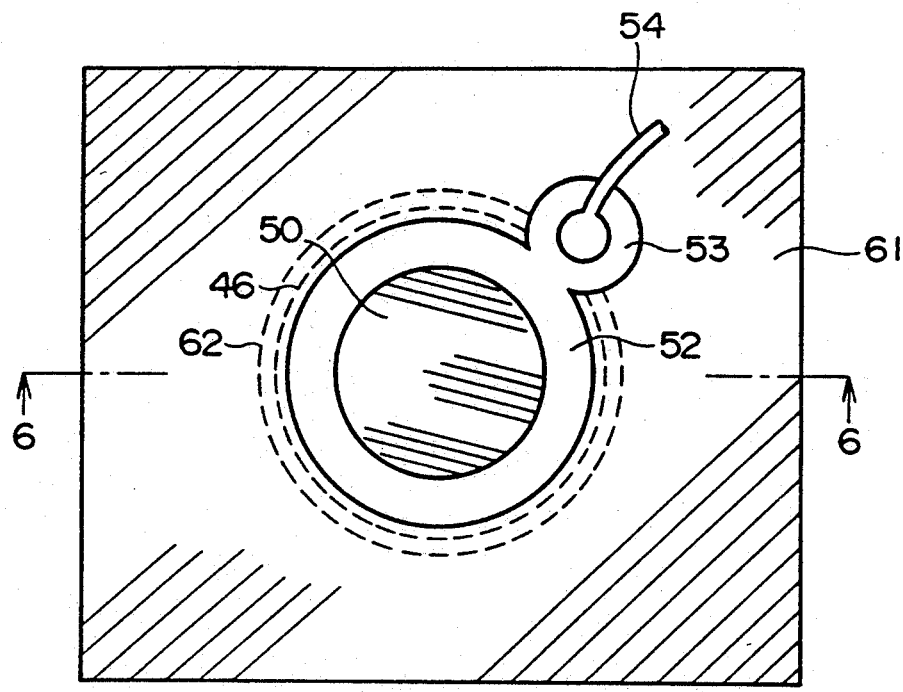
FIG. 5 is a plan view of a semiconductor photodetector according to one embodiment of the present invention.
Figure 6:
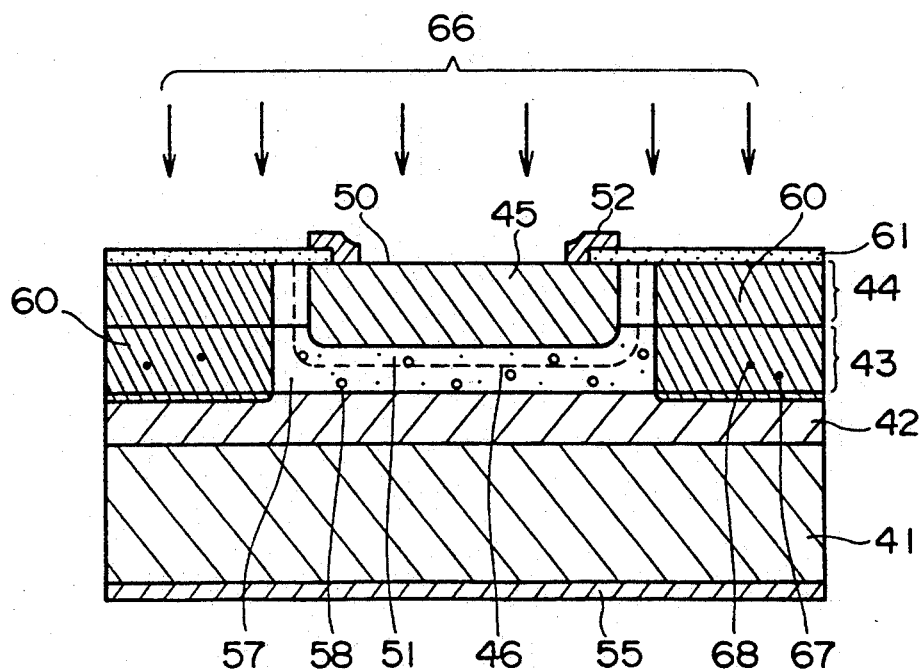
FIG. 6 is a cross-sectional view along the line 6—6 in FIG. 5.

FIG. 5 is a plan view of an InGaAs planar photodiode according to one embodiment of the present invention, and FIG. 6 is a cross-sectional view of the photodiode shown in FIG. 5 along the line 6—6. The photodiode shown in FIGS. 5 and 6 comprises an n-type buffer layer 42, an n$^-$-type InGaAs light absorbing layer 43, and an n$^-$-type InP window layer 44, which are successively stacked in the named order on an n$^+$-type InP substrate 41, with the buffer layer 42 contacting the substrate 41. A p-type impurity such as Zn, is diffused into the structure through that portion of the surface of the n$^-$-type InP window layer 44 which will be a light receiving region 50, whereby a reversed conductivity type, p$^+$-type, region 45 is formed. In the illustrated embodiment the lowermost portion of the p$^+$-type region 45 extends into the n$^-$-type InGaAs light absorbing layer 43. However, it may extend only to a depth several microns above the top of the light receiving layer 43. A broken line 46 represents a depletion layer front of a depletion layer 51. The depletion layer front 46 substantially serves as a PN junction between the p$^+$-type region 45 and the n$^-$-type InP window layer 44 and the n$^-$-type InGaAs light absorbing layer 43. A short carrier lifetime region 60 in which minority carriers, holes in the illustrated example, has a shortened lifetime, is formed in the window layer 44 and the light absorbing layer 43 around the depletion layer 51. The short lifetime region 60 may be formed by, for example, diffusion of an n-type impurity, such as Si, Te, S, Se, and Sn, or by implantation, such as proton implantation. The lifetime of holes in the region 60 is from $10^{-2}$ to $10^{-8}$ times that of holes within ordinary undoped InGaAs. A broken line circle 62 in FIG. 5 represents the inner edge of the short carrier lifetime region 60. A surface protecting film 61 of a material, such as SiN, transmissive to light formed by plasma CVD, for example, as in conventional photodiodes is disposed on the window layer 44. The surface protecting film 61 has its thickness t and refractive index n determined in accordance with the previously mentioned expressions (1) and (2) so that it can act as an AR film for incident light indicated by arrows 66.

A p-electrode (anode) 52 is disposed on the portion of the surface protecting layer 61 along the periphery of the light receiving region 50. The p-electrode 52 extends to make ohmic contact with the p-type region 45. As shown in FIG. 5, a portion of the p-electrode 52 projects outward to provide an electrode pad 53 to which an anode lead wire 54 is bonded. Furthermore as shown in FIG. 6 an n-electrode (cathode) 55 is disposed on the lower surface of the substrate 41.

As light 66 is incident onto the device, pairs of electrons 57 and holes 58 are generated by incident light in the light absorbing layer 43.

Examples of various values in the photodiode shown in FIGS. 5 and 6 are as follows. The carrier concentration of the substrate 41 may be from $1 \times 10^{18}$ cm$^{-3}$ to $5 \times 10^{18}$ cm$^{-3}$, the carrier concentration of the buffer layer 42 may be from $1 \times 10^{16}$ cm$^{-3}$ to $5 \times 10^{15}$ cm$^{-3}$, the carrier concentration of the light absorbing layer 43, excluding the short lifetime region 60 is from $1 \times 10^{-}$ cm$^{-3}$ to $1 \times 10^{16}$ cm$^{-3}$, preferably in the order of $5 \times 10^{15}$ cm$^{-3}$. and the carrier concentration of the window layer 44 excluding the short lifetime region 60 is from $1 \times 10^{15}$ cm$^{-3}$ to $1 \times 10^{16}$ cm$^{-3}$. An example of the carrier concentration of the p$^+$-type region 45 is from $1 \times 10^{18}$ cm$^{-3}$ to $1 \times 10^{19}$ cm$^{-3}$, and an example of the carrier concentration of the short carrier lifetime region 60 is from $1 \times 10^{18}$ cm$^{-3}$ to $1 \times 10^{19}$ cm$^{-3}$. It should be noted that these values are just examples, and they may differ depending on a particular wavelength of incident light and a desired characteristic of a photodiode.

Figure 1:
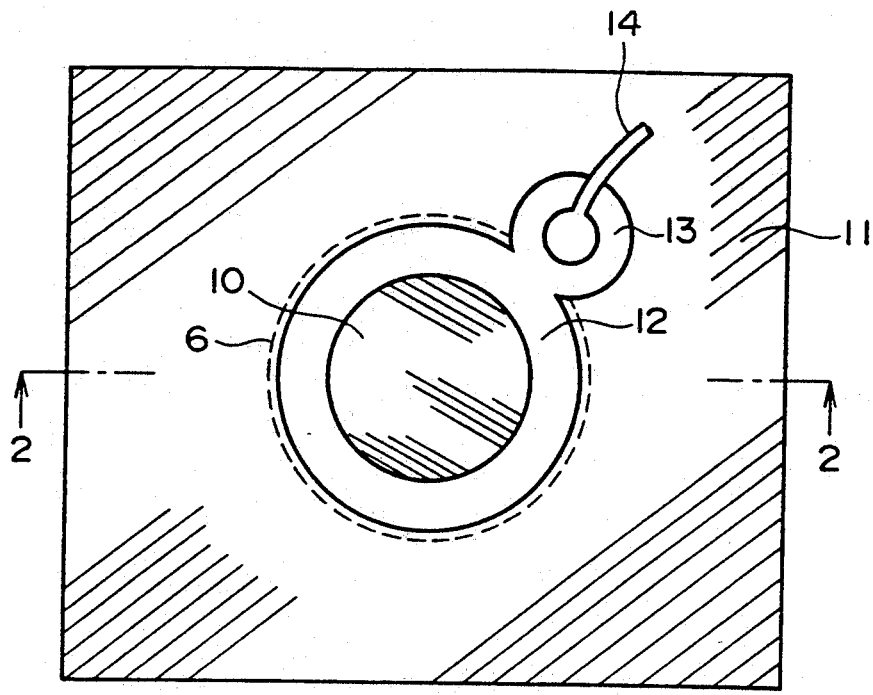
FIG. 1 is a plan view of an example of conventional semiconductor photodetector device.
Figure 2:
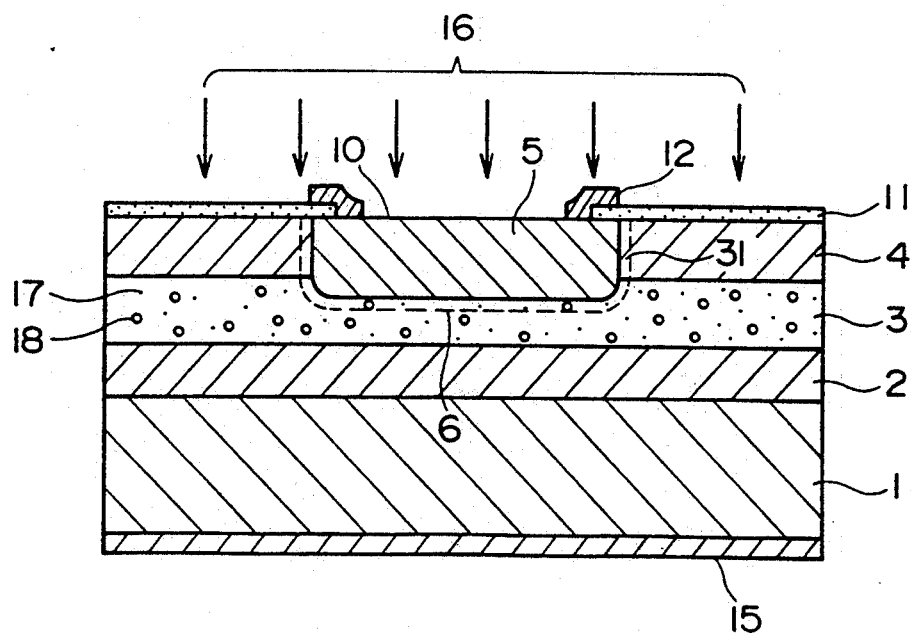
FIG. 2 is a cross-sectional view along the line 2—2 in FIG. 1.
Figure 3:
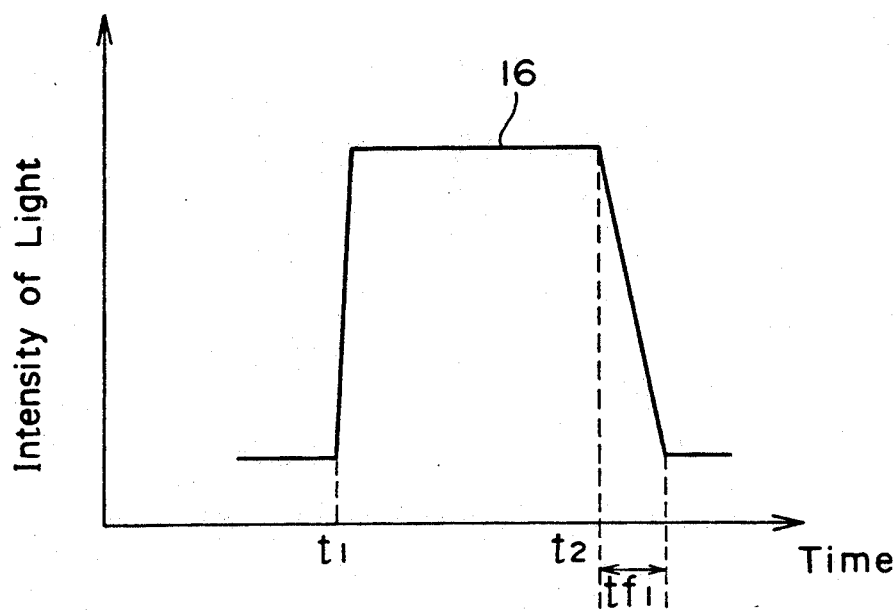
FIG. 3 shows a waveform of an example of incident light changing in intensity like a pulse which is incident on a semiconductor photodetector device.
Figure 4:
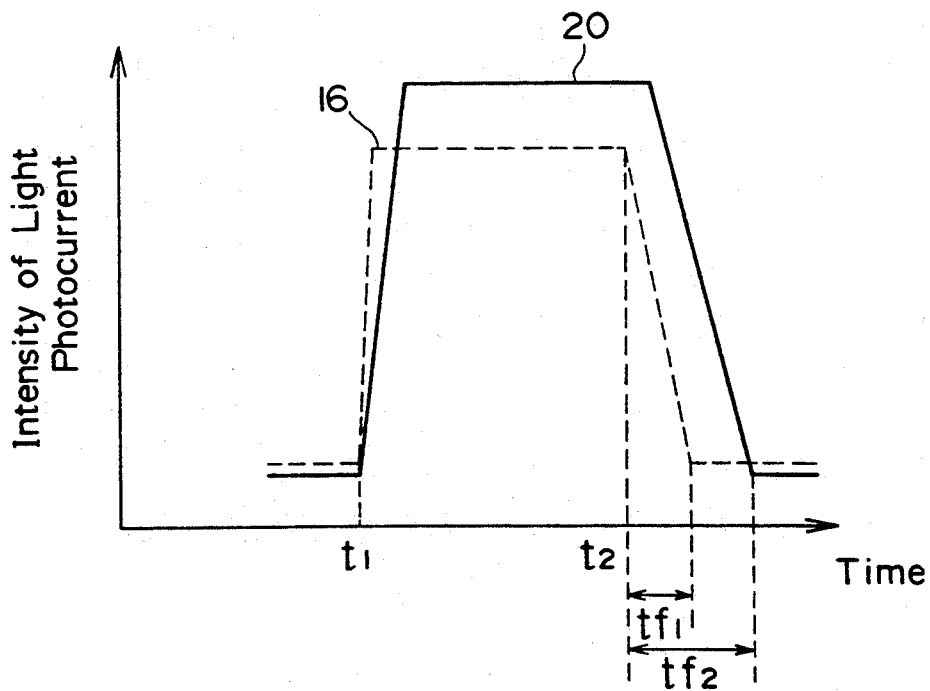
FIG. 4 shows a waveform of photocurrent generated by a conventional photodetector such as the one shown in FIG. 1 in response to incident light shown in FIG. 3.

Now, the operation of the photodiode shown in FIGS. 5 and 6 is described. As in the conventional photodiode shown in FIGS. 1 and 2, the bandgap wavelength $\lambda g$ of the n$^-$-type InGaAs light absorbing layer 43 is about 1.67 $\mu$m, and the bandgap wavelength $\lambda g$ of the n$^-$-type InP window layer 44 is about 0.93 $\mu$m. The wavelength at which the InGaAs photodiode according to the present invention exhibits sensitivity is within a band of from 1.0 $\mu$m to 1.6 $\mu$m. Then, the wavelength $\mu$ of the incident light 66 is assumed to be about 1.3 $\mu$m.

As already explained with reference to the conventional photodiode, a voltage of 0 V or a negative voltage of from $-5$V to $-10$ V relative to the potential of the n-electrode 55 is applied to the p-electrode 52 of the photodiode of the present invention. When light 66 at a wavelength of 1.3 $\mu$m impinges on the entire area including the light receiving region 50 of the photodiode, with the above-described voltage being applied to the p-electrode 52, the light is not absorbed in the window layer 44 having a bandgap wavelength $\lambda g$ of about 0.93 $\mu$m, but is absorbed in the light absorbing layer 43 of which the bandgap wavelength $\lambda g$ is about 1.67 $\mu$m. This causes pairs of electrons 57 and holes 58 to be generated in the light absorbing layer 43. Carriers comprising pairs of electrons 57 and holes 50 generated in the depletion layer 51 beneath the p$^+$-type region 45 are extracted through the electrodes 52 and 55, as drift current caused by the electric field in the depletion layer 51, and are monitored by an external circuit. Those holes of the carriers outside the depletion layer 51, which are generated in the light absorbing layer 43 beneath the p$^+$-type region 45 diffuse to reach the depletion layer 51 and are derived as drift current, too. The diffusion distance these holes travel to arrive at the depletion layer 51 is relatively short, and, therefore, a delay in response which could be caused by such holes is essentially negligible.

Light incident on the areas other than the light receiving region 50 also generate pairs of electrons 67 and holes 68 in the portion of the light absorbing layer 43 outside the depletion layer 51. However, since the lifetime of holes 68, in particular, is shortened due to the short carrier lifetime region 60, substantially no holes arrive at the depletion layer 51, or, if any, only those holes which are generated within a short diffusion distance arrive. Accordingly, the photocurrent detected by the external circuit contains substantially no current component which would be attributable to carriers diffusing over a long distance and which could cause a delay in response. Thus, the photodiode according to the present invention can respond quickly to changes in incident light. Since an AR coating is used as the surface protecting film 16 for the photodiode of the present invention, almost 100% of incident light can enter through the surface protecting film 61 into the structure. However, because the lifetime of holes generated by the incidence of light is shortened for the reason stated above no delay in response occurs. Furthermore because of substantially 0% reflection provided by the use of an AR coating, there are no adverse effects to a light source from reflected light.

To sum up, due to the short lifetime region 60 disposed around the reversed conductivity type region 45, carriers generated by light entering the regions outside the depletion layer disappear in a short time and therefore here are substantially no carriers that would reach the depletion layer and could by diffusion, produce a delayed photocurrent. Thus, the photodetector device according to the present invention can respond fast to rapidly varying incident light to generate photocurrent without time delay. Furthermore even when the center of an incident light beam deviates from the center of the light receiving region 50 for some reason so that the light beam is incident on areas other than the light received region 50 and causes a number of carriers to be generated in regions outside the depletion layer 51, the response speed is never degraded.

What is claimed is:

1. A semiconductor photodetector device comprising:
   a semiconductor substrate of a first conductivity type;
   a light absorbing layer of the first conductivity type having a bandgap and disposed on said substrate for generating minority and majority charge carriers in response to incident light, the charge carriers having lifetimes in said light absorbing layer before recombination;
   a window layer of the first conductivity type having a light incident surface and disposed on said light absorbing layer, said window layer having a bandgap wider than the bandgap of said light absorbing layer;
   a second conductivity type region of an opposite conductivity type from the first conductivity type extending from the light incident surface of said window layer into said window layer and at least proximate said light absorbing layer so that a depletion layer adjacent said second conductivity type region is contained with in said light absorbing layer and said window layer;
   a surface protecting film substantially transparent to incident light disposed on part of said second conductivity type region at the light incident surface of said window layer and on part of the light incident surface of said window layer;
   a short lifetime region of the first conductivity type disposed within said light absorbing layer circumferentially surrounding said second conductivity type region, the lifetime of the minority carries within said short lifetime region being less than one hundredth the lifetime of the minority carriers within said light absorbing layer outside said short lifetime region;
   a first electrode disposed on said surface protecting film in electrical contact with said second conductivity type region; and
   a second electrode disposed on and in electrical contact with said semiconductor substrate.

2. A semiconductor photodetector device comprising:
   an InP substrate of a first conductivity type;
   an InGaAs light absorbing layer of the first conductivity type having a bandgap and disposed on said InP substrate for generating minority and majority charge carriers in response to incident light, the charge carriers having lifetimes in said light absorbing layer before recombination;
   an InP window layer of the first conductivity type having a light incident surface and disposed on said light absorbing layer, said InP window layer having a bandgap wider than the bandgap of said InGaAs light absorbing layer;
   a second conductivity type region of an opposite conductivity type form the first conductivity type extending from the light incident surface of said InP window layer into said InP window layer and at least proximate said light absorbing layer so that a depletion layer adjacent said second conductivity type region is contained within said light absorbing layer and said window layer;
   a surface protecting film substantially transparent to incident light disposed on part of said second conductivity type region at the light incident surface of said window layer and on part of the light incident surface of said window layer;
   a short lifetime region of the first conductivity type disposed within said light absorbing layer circumferentially surrounding said second conductivity type region, the lifetime of the minority carriers within said short lifetime region being less than one-hundredth the lifetime of the minority carriers within said light absorbing layer outside said short lifetime region;
   a first electrode disposed on said surface protecting film in electrical contact with said second conductivity type region; and
   a second electrode disposed on and in electrical contact with said semiconductor substrate.

3. The semiconductor photodetector device according to claim 1 wherein said first conductivity type is n-type and said second conductivity type is p-type, said second conductivity type region contains a p-type impurity, such as Zn, diffused from the light incident surface of said window layer, and said short lifetime region contains an n-type impurity, such as at least one of Si, Te S, Se, and Sn, diffused or implanted from the surface of said window layer.

4. The semiconductor photodetector device according to claim 2 wherein said first conductivity type is n-type and said second conductivity type is p-type, said second conductivity type region contains a p-type impurity, such as Zn, diffused form the light incident surface of said window layer, and said short lifetime region contains an n-type impurity, such as at least one of Si, Te, S, Se, and Sn, diffused or implanted from the surface of said window layer.

5. The semiconductor photodetector device according to claim 1 wherein said short lifetime region contains implanted protons.

6. The semiconductor photodetector device according to claim 2 wherein said short lifetime region contains implanted protons.

7. The semiconductor photodetector device according to claim 1 wherein said second conductivity type region extends through said window layer and into said light absorbing layer.

8. The semiconductor photodetector device according to claim 2 wherein said second conductivity type region extends through said window layer and into said light absorbing layer.

9. The semiconductor photodetector device according to claim 1 wherein said short lifetime region extends through said window layer and into said light absorbing layer.

10. The semiconductor photodetector device according to claim 9 wherein said short lifetime region extends through said light absorbing layer.

11. The semiconductor photodetector device according to claim 2 wherein said short lifetime region extends through said window layer and into said light absorbing layer.

12. The semiconductor photodetector device according to claim 11 wherein said short lifetime region extends through said light absorbing layer.

13. The semiconductor photodetector device according to claim 1 including a first conductivity type buffer layer interposed between and contacting said substrate and said light absorbing layer.

14. The semiconductor photodetector device according to claim 2 including a first conductivity type buffer layer interposed between and contacting said substrate and said light absorbing layer.

* * * * *

UNITED STATES PATENT AND TRADEMARK OFFICE
CERTIFICATE OF CORRECTION

PATENT NO. : 5,272,364
DATED : December 21, 1993
INVENTOR(S) : Misao Hironaka

It is certified that error appears in the above-indentified patent and that said Letters Patent is hereby corrected as shown below:

On the title page:
In Item [56], References Cited, under Foreign Patent Documents, change "2-214171 2/1990" to --2-214171 8/1990--.

In Item [57], Abstract, line 5, change "ht" to --the--.

Col. 7, line 49, change "with in" to --within--.
Col. 8, line 16, change "form" to --from--.

Col. 8, line 48, after "Te" insert --,--.
Col. 8, line 54, change "form" to --from--.

Signed and Sealed this

Twentieth Day of September, 1994

*Attest:*

BRUCE LEHMAN

*Attesting Officer*    *Commissioner of Patents and Trademarks*